United States Patent
Asano et al.

(10) Patent No.: US 7,642,661 B2
(45) Date of Patent: Jan. 5, 2010

(54) LIQUID EPOXY RESIN COMPOSITION

(75) Inventors: Masatoshi Asano, Annaka (JP); Kaoru Katoh, Annaka (JP); Kazuaki Sumita, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 309 days.

(21) Appl. No.: 11/601,659

(22) Filed: Nov. 20, 2006

(65) Prior Publication Data
US 2007/0116962 A1    May 24, 2007

(30) Foreign Application Priority Data
Nov. 21, 2005   (JP)   ............... 2005-336074
Nov. 9, 2006    (JP)   ............... 2006-304194

(51) Int. Cl.
H01L 23/29   (2006.01)
B32B 27/04   (2006.01)
B32B 27/38   (2006.01)
C08L 63/00   (2006.01)
C08L 83/00   (2006.01)

(52) U.S. Cl. .................. 257/793; 257/787; 257/788; 257/791; 428/413; 525/476

(58) Field of Classification Search .............. None
See application file for complete search history.

(56) References Cited

U.S. PATENT DOCUMENTS 5,128,746 A   7/1992   Pennisi et al.
5,863,970 A * 1/1999   Ghoshal et al. ............. 523/434
2004/0014843 A1 * 1/2004  Sumita et al. .............. 523/400

FOREIGN PATENT DOCUMENTS

| JP | 2001-223227 A | 8/2001 |
|----|---------------|--------|
| JP | 2001-329048 A | 11/2001 |
| JP | 2002-190497 A | 7/2002 |
| JP | 2002-232123 A | 8/2002 |
| JP | 2002-293883 A | 10/2002 |
| JP | 2003-82064 A  | 3/2003 |
| JP | 2003-128874 A | 5/2003 |
| JP | 2003-160639 A | 6/2003 |
| JP | 2004-303874 A | 10/2004 |

OTHER PUBLICATIONS

Product Data for Ciba Irganox 1035 (1999).*

* cited by examiner

Primary Examiner—Michael J Feely
(74) Attorney, Agent, or Firm—Birch, Stewart, Kolasch & Birch, LLP

(57) ABSTRACT

A liquid epoxy resin composition comprising:
(A) a liquid epoxy resin;
(B) an amine type curing agent;
(C) a sulfur-containing phenol compound in an amount of from 1 to 20 parts by weight per total 100 parts by weight of the components (A) and (B); and
(D) an inorganic filler in an amount of from 50 to 900 parts by weight per 100 parts by weight of the component (A).

7 Claims, 1 Drawing Sheet

LIQUID EPOXY RESIN COMPOSITION

This application claims benefit of Japanese Patent application No. 2005-336074 filed on Nov. 21, 2005, and Japanese Patent application No. 2006-304194, filed on Nov. 9, 2006, the contents of which are hereby incorporated by reference.

FIELD OF THE INVENTION

The present invention relates to a liquid epoxy resin composition for encapsulating a semiconductor device. The present invention also relates to a semiconductor device encapsulated with the composition. The present composition is easy to handle and allows simplification of semiconductor device production process.

BACKGROUND OF THE INVENTION

As semiconductor devices are getting smaller, thinner and lighter, more and more semiconductor chips are integrated in a device. The semiconductor chip is commonly mounted on a circuit board by flip-chip attach method. A typical flip-chip attach method is the controlled collapse chip connection (C4) process in which electrodes of the semiconductor chip is directly soldered with solder bumps or lands on a circuit board. After the soldering, the gap between the chip and the circuit board is sealed or encapsulated with an epoxy resin.

In conventional C4 process, the resin encapsulation is performed by capillary flow method. However, the process has drawback of low productivity due to many steps involved: 1) treatment of solder with flux, 2) soldering, 3) cleaning of the flux, 4) injection of an encapsulation resin by capillary flow method, and 5) curing of the resin. As pads are getting finer with narrower pitch, cleaning of the flux is getting more and more difficult. Residual flux on the circuit board respells an encapsulation resin, and ionic impurities in residual flux degrade reliability of a device package.

To solve these problems, U.S. Pat. No. 5,128,746 discloses a non-flow method in which soldering and resin encapsulation is performed in a single step by applying an encapsulation resin comprising flux component to a circuit board and then placing a semiconductor chip having solder electrodes on the applied resin.

For use in the non-flow method, various compositions comprising a curing agent performing as flux as well are proposed, for example, a phenolic resin as described in Japanese Patent Application Laid-Open No.2002-232123, a phenolic carboxylic acid as described in Japanese Patent Application Laid-Open No. 2003-128874, an acid anhydride as described in Japanese Patent Application Laid-Open No. 2001-329048 and 2003-160639, a carboxylic acid as described in Japanese Patent Application Laid-Open No. 2002-293883 and an aromatic carboxylic acid hydrazide as described in Japanese Patent Application Laid-Open No. 2004-303874.

A composition comprising a flux component besides a curing agent are also known. For example, a composition comprising a carboxylic acid or a block carboxylic acid as flux component in addition to a phenolic or acid anhydride curing agent are known from Japanese Patent Application Laid-Open No. 2002-190497, 2003-82064, and 2001-223227.

SUMMARY OF THE INVENTION

Most of the curing agents in the aforesaid compositions are phenolic or acid anhydrides curing agents. Comparing these curing agents, an amine curing agent generally can provide a cured product with stronger adhesion to a substrate and less exfoliation from the substrate or a semiconductor chip. In Japanese Patent Application Laid-Open No. 2002-293883, an amine adduct curing agent is examined but it is concluded that the amine adduct has no flux capability.

An object of the present invention is to provide a composition which comprises an amine curing agent and is advantageously used in the non-flow method.

The inventors have found that an epoxy resin composition comprising a sulfur-containing phenol compound is suitably used as an encapsulation resin in the non-flow method.

Thus, the present invention is a liquid epoxy resin composition comprising:
(A) a liquid epoxy resin;
(B) an amine type curing agent;
(C) a sulfur-containing phenol compound in an amount of from 1 to 20 parts by weight per total 100 parts by weight of the components (A) and (B); and
(D) an inorganic filler in an amount of from 50 to 900 parts by weight per 100 parts by weight of the component (A).

The present invention also provides a composition for encapsulating a flip-chip type semiconductor comprising the aforesaid present composition, and a flip-chip type semiconductor device comprising a cured product of the composition.

By utilizing the sulfur-containing compound's capability as flux in addition to strong adhesion strength attained by the amine curing agent, the present liquid epoxy composition is suitable for use in the non-flow method for manufacturing flip-chip type semiconductor devices.

PREFERRED EMBODIMENTS OF THE INVENTION

Figure 1:
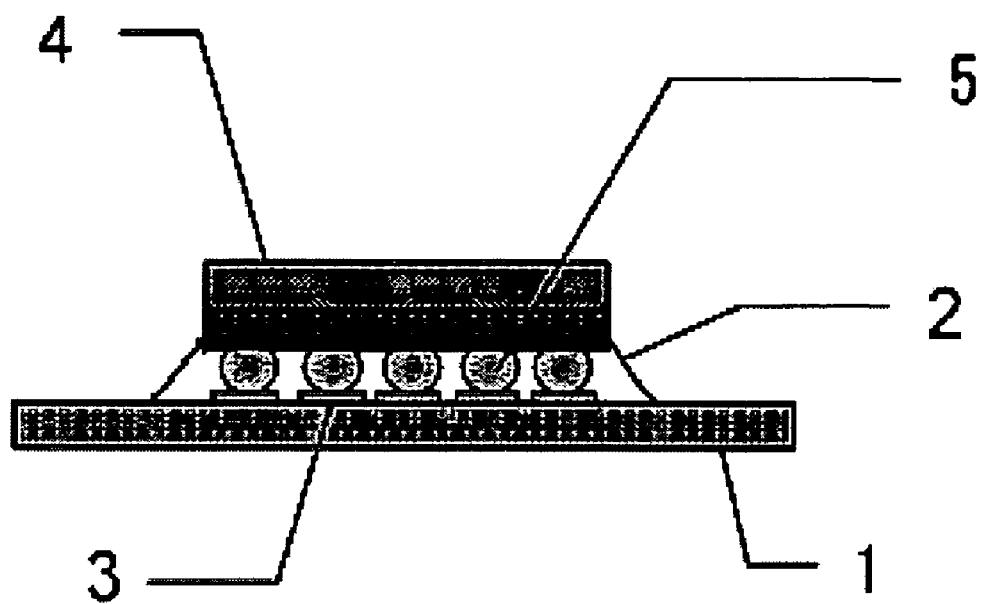
FIG. 1 is a cross sectional view of a flip-chip type semiconductor device of the present invention.

Each component of the present composition will be explained.

(A) Liquid Epoxy Resin

In the present invention, the liquid epoxy resin has at least two epoxy groups per molecule and is liquid, including viscous liquid, at room temperature. As the liquid epoxy resin, known epoxy resins can be used. Examples of the liquid epoxy resin include bisphenol A type epoxy resins, bisphenol AD type epoxy resins, bisphenol F type epoxy resins, naphthalene type epoxy resins, phenol novolac type epoxy resins, biphenyl type epoxy resins, glycidylamine epoxy resins, cycloaliphatic epoxy resins, dicyclopentadiene type epoxy resins, and a mixture of two or more of these. Among these, bisphenol A type epoxy resins, bisphenol F type epoxy resins, bisphenol AD type epoxy resins, and naphthalene type epoxy resins are preferred because of good resistance to heat and moisture.

Preferably, a total content of chlorine, originating from epichlorohydrin used to prepare the epoxy resin, of the epoxy resin is not more than 1500 ppm, more preferably not more than 1000 ppm. Further, the epoxy resin has a content of chlorine extractable with deionized water at 100° C. for 20 hours is not more than 10 ppm.

(B) Amine Type Curing Agent

Examples of the amine type curing agent in the present composition include aromatic amines, aliphatic amines, polyamideamines, imidazols, and guanidines. Among these, aromatic amines are preferred because a composition containing an aromatic amine attains high adhesion strength to provide reliable device packages which is resistant to heat and moisture.

Examples of preferred aromatic amine curing agent include 3,3'-diethyl-4,4'-diaminodiphenymethane, 3,3',5,5'-tetramethyl-4,4'-diaminodiphenylmethane, 3,3',5,5'-tetraethyl-4,4'-diaminodiphenylmethane, 2,4-diaminotluene, 1,4-phenylenediamine, 1,3-phenylenediamine and a mixture of two or more of these.

An amine curing agent, which is solid at room temperature but can be melt mixed with the epoxy resin or a liquid amine, is preferably melt mixed at a temperature of from 70 to 150° C. for 1 to 2 hours prior to mixing with other components. At a temperature below 70° C. or a period of time shorter than 1 hr, the solid amine may not be sufficiently mixed. Above 150° C. or a period of time longer than 2 hours, a reaction with the epoxy rein may occur, leading to increase in viscosity of a composition.

The amine curing agent is contained in the composition in such an amount that a molar ratio of epoxy groups of the epoxy resin (A) to active hydrogen atoms of the amine curing agent (B), [a molar amount of epoxy groups of the epoxy resin (A)/ a molar amount of active hydrogen atoms of the amine curing agent (B)], ranges from 0.7 to 1.1, preferably from 0.8 to 1.0. When component (E), which is described later, is contained, a molar ratio of total epoxy groups of components (A) and (E) to active hydrogen of the amine curing agent, [a total molar amount of epoxy group of components (A) and (E)/ a molar amount of active hydrogen of component (B)], ranges from 0.7 to 1.1, preferably from 0.8 to 1.0. When silicone-modified phenolic resin in place of component (E) is contained, a molar ratio of component (A) to total active hydrogen atoms of components (B) and (E), [a molar amount of component (A)/ a total molar amount of active hydrogen of components (B) and (E)], ranges from 0.7 to 1.1, preferably from 0.8 to 1.0. If the ratio is below 0.7, there remain amino groups or phenolic hydroxyl groups unreacted, and a cured product may have a lower glass transition temperature and lower adhesion strength. If the ratio exceeds 1.1, a cured product is so brittle that it may crack during reflow process.

(C) Sulfur-containing Phenol Compound

The present composition is characterized in that it comprises a sulfur-containing phenol compound. The compound was found to function as flux. Mechanism for the function is unknown, but is considered to be oxygen-capturing capability of sulfur in addition to reducing property of a phenolic hydroxyl group. Preferably, the compound has an electron-donating substituent such as an alkyl group, and, more preferably, has a bulky group such as t-butyl group, on at least one ortho-position relative to the phenolic hydroxyl group. The electron-donating group increases the reducing property of the phenolic hydroxyl group. In addition, steric hindrance due to a bulky group prevents reaction with the epoxy group.

Examples of the sulfur-containing phenol compound include 2,2-thiodiethylene bis[3-(3,5-di-t-butyl-4-hydroxyphenyl)propionate], 2,4-bis[(octylthio)methyl]-o-cresol, 4,4-thiobis-(2-t-butyl-5-methylphenol), bis(3,5-di-t-butyl-4-hydroxyphenyl)2,9-dimethyl-4,7-dithiadecanedioate, 2,2-thiobis(4-methyl-6-t-butylphenol) and a mixture thereof, among which 2,2-thiodiethylene bis[3-(3,5-di-t-butyl-4-hydroxyphenyl)propionate], 2,4-bis[(octylthio)methyl]-o-cresol, 4,4-thiobis-(2-t-butyl-5-methylphenol), and a mixture thereof are preferred. These compounds functions as good flux even at a temperature of soldering as high as 260° C. employed in the present Examples.

The sulfur-containing phenol compound is contained in the composition in an amount of from 1 to 20 parts by weight, preferably from 1 to 10 parts by weight per total 100 parts by weight of the epoxy resin (A) and the amine curing agent (B). If it is contained in an amount less than 1 part by weight, sufficient flux property may not be attained. If it is contained in an amount above the aforesaid upper limit, glass transition temperature of a resulting curing product may be too low or adhesion strength of the curing product may be too low.

When the sulfur-containing phenol compound is solid at room temperature, it may be pulverized and then mixed in the form of solid. However, depending on a content of the sulfur-containing phenol compound, viscosity of the composition may be increased to cause handling problem. Therefore, it is preferred to melt mix such a solid sulfur-containing phenol with the liquid epoxy resin or liquid aromatic amine, if present, prior to mixing with other components. Preferably, the melt mixing is performed at a temperature of from 70 to 150° C. for 1 to 2 hours.

(D) Inorganic Filler

By containing the inorganic fillers, a cured product of the composition has a reduced thermal expansion coefficient. Any known filler can be used, for example, fused silica, crystalline silica, alumina, titanium dioxide, silica/titania, boron nitride, aluminum nitride, silicon nitride, magnesia, magnesium silicate, aluminum and a mixture of two or more of these. Preferably, spherical fused silica is used because of a lower viscosity of a composition containing the fused silica.

The inorganic filler is preferably pretreated with a coupling agent such as silane coupling agent or titanate coupling agent to increase affinity to the resins. Preferably, silane coupling agents are used whose examples include epoxy silanes such as γ-glycidoxypropyltrimethoxysilane, γ-glycidoxypropylmethyldiethoxysilane, β-(3,4-dpoxycyclohexyl)ethyltrimethoxysilane; aminosilanes such as N-β(aminoethyl)-γ-aminopropyltrimethoxysilane, γ-aminopropyltriethoxysilane, N-phenyl-γ-aminopropyltrimethoxysilane; and mercaptosilanes such as γ-mercaptosilane.

The inorganic filler is contained in the composition in an amount of from 50 to 900 parts by weight, preferably from 100 to 500 parts by weight per 100 parts by weight of the epoxy resin. A composition containing the filler in an amount below the aforesaid lower limit gives a cured product which may have larger expansion coefficient which may crack in a heat cycle test. A composition containing the filler in an amount above the aforesaid upper limit may has higher viscosity which tends to form voids in a cured product. Further, the filler may inhibit solder connection.

The present composition may contain the following components in an amount not to adversely affect the composition.

(E) Silicone-modified Epoxy Resin

The present composition may contain a silicone-modified epoxy resin as a flexibilizer to make a cured product flexible. Examples of the flexibilizer include silicone resins in the form of powder, rubber, and oil, thermoplastic resins such as liquid polybutadiene rubber and acrylic core-shell resin. Preferably, the silicone-modified epoxy resin is used. Particularly, a addition reaction product of an epoxy resin or a phenolic resin with an organopolysiloxane. The epoxy resin or a phenolic resin has an alkenyl group and is represented by the following formulas (1), (2), (3) or (4).

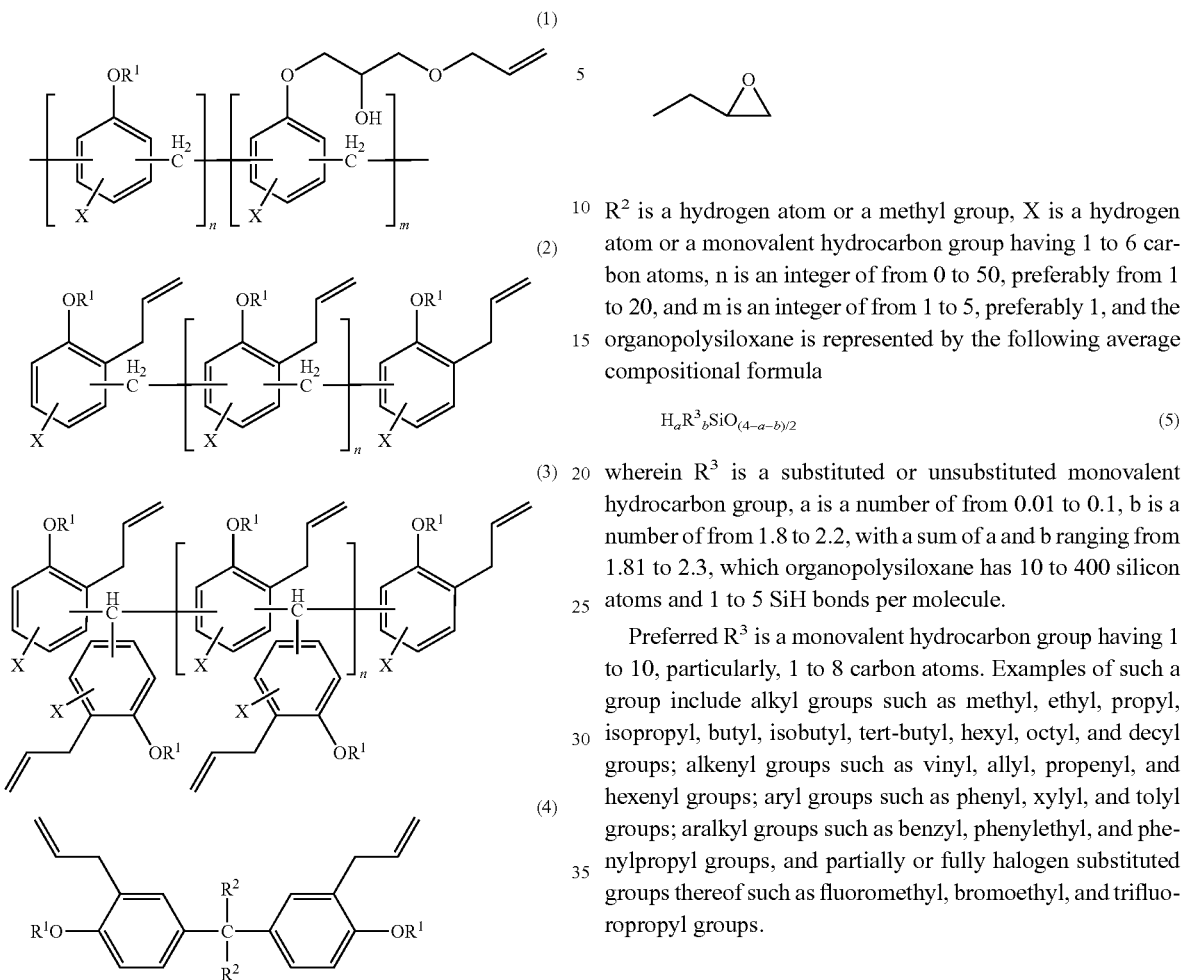

wherein $R^1$ is a hydrogen atom or the group shown below, $R^2$ is a hydrogen atom or a methyl group, X is a hydrogen atom or a monovalent hydrocarbon group having 1 to 6 carbon atoms, n is an integer of from 0 to 50, preferably from 1 to 20, and m is an integer of from 1 to 5, preferably 1, and the organopolysiloxane is represented by the following average compositional formula $$H_a R^3_b SiO_{(4-a-b)/2} \qquad (5)$$

wherein $R^3$ is a substituted or unsubstituted monovalent hydrocarbon group, a is a number of from 0.01 to 0.1, b is a number of from 1.8 to 2.2, with a sum of a and b ranging from 1.81 to 2.3, which organopolysiloxane has 10 to 400 silicon atoms and 1 to 5 SiH bonds per molecule.

Preferred $R^3$ is a monovalent hydrocarbon group having 1 to 10, particularly, 1 to 8 carbon atoms. Examples of such a group include alkyl groups such as methyl, ethyl, propyl, isopropyl, butyl, isobutyl, tert-butyl, hexyl, octyl, and decyl groups; alkenyl groups such as vinyl, allyl, propenyl, and hexenyl groups; aryl groups such as phenyl, xylyl, and tolyl groups; aralkyl groups such as benzyl, phenylethyl, and phenylpropyl groups, and partially or fully halogen substituted groups thereof such as fluoromethyl, bromoethyl, and trifluoropropyl groups.

A preferred silicone-modified epoxy resin is represented by the following formula (6).

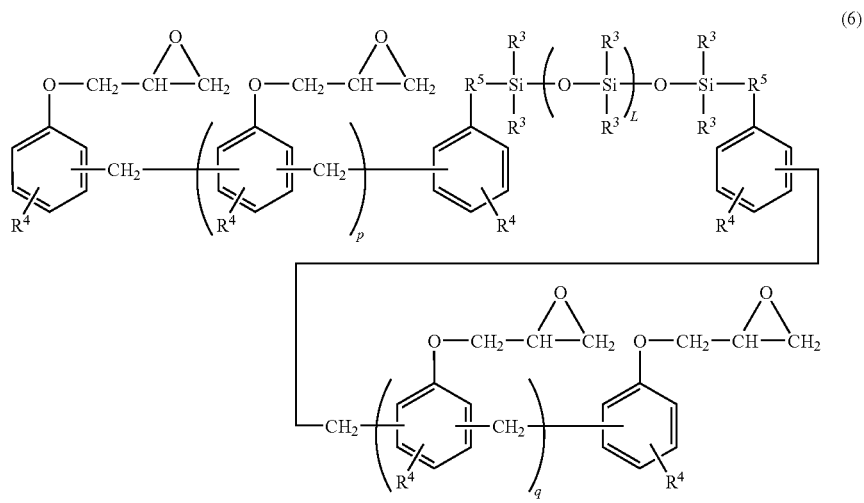

In the above formula (6), $R^4$ is a hydrogen atom or a monovalent hydrocarbon group having 1 to 6 carbon atoms, and $R^5$ is a divalent group represented by the formula, —$CH_2CH_2CH_2$—, —$OCH_2$—$CH(OH)$—$CH_2$—O—$CH_2CH_2CH_2$— or —O—$CH_2CH_2CH_2$—. L is an integer of from 8 to 398, preferably from 18 to 198 and p is an integer of from 1 to 10, and q is an integer of from 1 to 10.

Examples of $R^4$ include alkyl groups such as methyl, ethyl, propyl, isopropyl, butyl, isobutyl, tert-butyl, hexyl, octyl, and decyl groups; cycloalkyl groups such as cyclopentyl and cyclohexyl groups; alkenyl groups such as vinyl, allyl, propenyl, and hexenyl groups; and aryl groups such as phenyl group, among which methyl group is preferred. $R^{4'}$ may be different from each other.

In the formula (6), p and q are integers of from 1 to 10, preferably from 1 to 5. If p and/or q is larger than 10, a cured product may be too hard, resulting in cracking, weak adhesion or low reliability of a device package.

In the formula (6), L is an integer of from 8 to 398, preferably from 18 to 198. A silicone-modified resin with L being less than 8 is not sufficiently flexible due to too little portion of polysiloxane moieties in a molecule. A resin with L being larger than 398 may be difficult to disperse in a composition, and a composition obtained has unstable quality.

Component (E) is incorporated in the composition in an amount of 20 parts by weight or less, particularly from 2 to 15 parts by weight, per 100 parts by weight of component (A) to attain sufficient flexibilizing effect.

Optional Additives

The present composition may contain optional additives such as cure promoters, surfactants, antifoaming agents, leveling agents, ion trap agents, pigments such as carbon black, and dye stuffs, in an amount not to adversely affect the composition.

The present composition can be prepared by mixing while heating, if needed, the liquid epoxy resin (A), the amine curing agent (B), sulfur-containing phenol compound (C), inorganic filler (D), and optional additives in a batch process or a serial process. Any mixing means can be used such as an automatic mortar equipped with a stirrer and a heater, a three-roller mill, a ball mill, and a planetary mixer. These mixing means may be used in combination.

The present liquid epoxy composition has a viscosity of 1000 Pa·s or smaller, particularly of 500 Pa·s or smaller, at 25° C. The composition is preferably cured at a temperature of from 100 to 120° C. for about 0.5 hour and then at a temperature of from 150 to 175° C. for about 0.5 to 4 hours. The first heating step ensures to obtain a cured product without voids. If a period of time of the second heating step at 150 to 175° C. is shorter than 0.5 hour, cured product may not have satisfactory properties.

FIG. 1 shows an example of a flip-chip type semiconductor package. In the package, a semiconductor chip 4 is mounted on a surface of an organic substrate having a circuit pattern via a plurality of solder bumps 5 on pads 3. The gap between the organic substrate 1 and the semiconductor chip 4 is filled or encapsulated with an underfill 2. The present composition is particularly useful as an underfill adhesive.

When the present liquid epoxy resin composition is used as an underfill, the composition forms a cured product having a coefficient of thermal expansion preferably of from 20 to 40 ppm/° C. at a temperature not higher than its glass transition temperature.

EXAMPLES

The present invention will be explained with reference to the examples but not limited thereto. In the following description, % means wt % and parts means parts by weight, unless otherwise specified.

The following substances are used.

(A) Liquid Epoxy Resin

Epoxy resin (a) : Bisphenol F type epoxy resin having an epoxy equivalent of 170, RE303S-L, ex Nippon Kayaku Co., Ltd. Epoxy resin (b) : Trifunctional epoxy resin of the following formula (7) having an epoxy equivalent of 101, Epikote 630H, Japan Epoxy Resin Co.

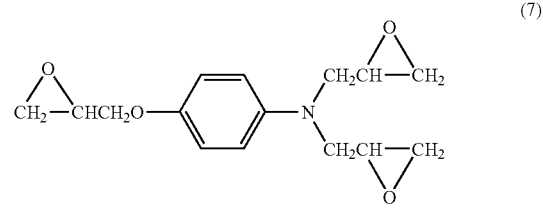

(7)

(B) Amine Curing Agent

Diethyldiaminodiphenylmethane having an amine equivalent of 63.5, Kayahard A-A, Nippon Kayaku Co., Ltd (C) Sulfur-Containing Phenol Compound 1) 2,2-thiodiethylene bis[3-(3,5-di-t-butyl-4-hydroxyphenyl) propionate], Irganox1035FF, ex Chiba Specialty Chemicals Co.
2) 2,4-bis[(octylthio)methyl]-o-cresol, Irganox1520, ex Chiba Specialty Chemicals Co.
3) 4,4-thiobis-(2-t-butyl-5-methylphenol), Sumilizer WX-R, ex Sumitomo Chemical Co., Ltd.

(D) Inorganic Filler

Spherical silica having an average particle diameter of 2 μm and a maximum particle diameter of 10 μm, ex Tatsumori Ltd.

(E) Silicone-Modified Epoxy Resin

An addition polymerization product of the compound of the following formula (8) with the compound of the formula (9).

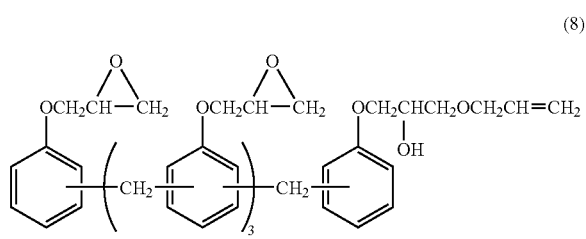

(8)

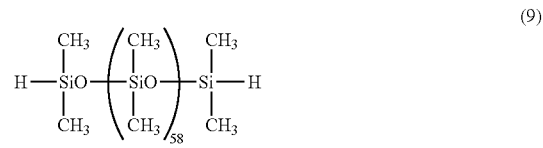

(9)

Other Additives

Carbon black: Denka black, ex Denki Kagaku Kogyo Kabushiki Kaisya

Silane coupling agent: γ-glycidoxypropyltrimethoxysilane, KBM403, ex Shin-Etsu Chemical Co. Ltd.

Compounds Used in Comparative Examples and Referential Examples

1) Abietic acid
2) 2,6-di-t-butyl-4-methylphenol, Sumilizer BHT, ex Sumitomo Chemical Co., Ltd.

3) Triethyleneglycol-bis[3-(3-t-butyl-4-hydroxy-5-methylphenyl)propionate, Irganox 245, ex Chiba Specialty Chemicals Co.
4) 1,6-hexanediol-bis[3-(3,5-di-t-butyl-4-hydroxyphenyl)propionate, Irganox 259, ex Chiba Specialty Chemicals Co.

Example 1

Using a planetary mixer, 31.8 parts by weight of the epoxy resin (a), 31.8 parts by weight of the epoxy resin (b), 2 parts by weight of 2,2-thiodiethylene bis[3-(3,5-di-t-butyl-4-hydroxyphenyl)propionate] dissolved in 33 parts by weight of diethyldiaminodiphenylmethane, 100 parts by weight of the spherical silica, 4 parts by weight of the silicone-modified epoxy resin, 1 part by weight of the silane coupling agent, and 1 part by weight of the carbon black were thoroughly mixed and then kneaded with a three-roller mill to well disperse solid substance. The mixture obtained was deaerated under vacuum, whereby a liquid epoxy resin composition was obtained.

Example 2

A composition was prepared in the same manner as in Example 1 except that 2,4-bis[(octylthio)methyl]-o-cresol was used in place of 2,2-thiodiethylene bis[3-(3,5-di-t-butyl-4-hydroxyphenyl)propionate]. Here, 2,4-bis[(octylthio)methyl]-o-cresol was mixed with other components as it is, without dissolving in diethyldiaminodiphenylmethane, because it is liquid at room temperature.

Example 3

A composition was prepared in the same manner as in Example 1 except that 4,4-thiobis-(2-t-butyl-5-methylphenol) was used in place of 2,2-thiodiethylene bis[3-(3,5-di-t-butyl-4-hydroxyphenyl)propionate].

Comparative Examples 1 and 2

Compositions were prepared in the same manner as in Example 1 except that, in place of 2,2-thiodiethylene bis[3-(3,5-di-t-butyl-4-hydroxyphenyl)propionate], abietic acid was used in Comparative Example 1, and no flux component was used in Comparative Examples 2. Here, abietic acid was dissolved in the liquid epoxy resins prior to mixing with other components.

Referential Examples 1 to 3

Compositions were prepared in the same manner as in Example 1 except that, in place of 2,2-thiodiethylene bis[3-(3,5-di-t-butyl-4-hydroxyphenyl)propionate], 2,6-di-t-butyl-4-methylphenol was used in Referential Example 1; triethyleneglycol-bis[3-(3-t-butyl-4-hydroxy-5-methylphenyl)propionate was used in Referential Example 2, and 1,6-hexanediol-bis[3-(3,5-di-t-butyl-4-hydroxyphenyl)propionate was used in Referential Example 3.

Each composition was evaluated by the following methods.

(1) Viscosity

Using a BH type rotating viscometer, viscosity at 25° C. was measured at 4 rpm.

(2) Storage stability

Each composition was kept in an atmosphere of 25° C. and a 60% RH for 48 hours. Potlife, i.e., a length of time a composition retains viscosity low enough to be processed, of each composition was rated according to the following criteria.

A: Long potlife with less than 30% change in viscosity from the initial viscosity B: A little bit short potlife with 30 to 50% change in viscosity from the initial viscosity C: Short potlife with more than 100% change in viscosity from the initial viscosity Viscosity was measured in the same manner as described (1) above.

(3) Adhesion Strength

On a silicon chip coated with cured photosensitive polyimide resin, each composition was molded in the shape of a circular truncated cone with a top surface diameter of 2 mm, a basal surface diameter of 5 mm and a height of 5 mm, by heating at 120° C. for 0.5 hour and then 165° C. for 3 hours. Initial adhesion strength of the molded product to the silicone chip was measured by pushing the side surface of the molded product at a speed of 0.2 mm/sec. This test piece was then placed in a pressure cooker tester and kept in an atmosphere of 121° C. and 2.1 atm for 336 hours. After taking out the test piece from the pressure cooker tester, adhesion strength of the molded product to the silicon chip was measured in the same manner as described above. Total five test pieces were tested and the obtained data were averaged.

(4) Soldering Property

A flip-chip type semiconductor chip having four sections per chip with 576 Sn3.0/Ag0.5/Cu solder bumps per section and a substrate were used. Each composition was applied on the substrate with a dispenser, on which the semiconductor chip was mounted with a flip-chip bonder at a soldering temperature of 260° C. for 3 seconds with 10N load. Then, the applied composition was cured at 120° C. for 0.5 hour and then 165° C. for 3 hours. Electrical connection of the semiconductor test piece thus obtained was examined. Total 10 test pieces, i.e., total 40 sections, were prepared for each composition and the number of sections was counted in which electrical connection via solder was confirmed.

(5) Void

The test pieces prepared in the above test were observed with a supersonic flow detector for voids. The number of chips in which a void was found were counted.

(6) Exfoliation

Among the test pieces prepared for the soldering property test, total 10 semiconductor chips without a void were kept in an atmosphere of 30° C. and 65% RH for 192 hours. Then, the test pieces were passed in an IR reflow furnace with a peak temperature of 265° C. for five times and then observed for cracks or exfoliation with the super sonic flow detector. The number of chips without cracks and exfoliation was counted.

Subsequently, the test pieces were kept in an atmosphere of 121° C. at 2.1 atm in a pressure cooker tester for 336 hours and observed for cracks or exfoliation with the super sonic flow detector. The number of chips without a crack and exfoliation was counted.

(7) Temperature Cycle Test

Among the test pieces prepared in the soldering property test, total 10 semiconductor chips without a void were kept in an atmosphere of 30° C. and 65% RH for 192 hours and then subjected to a heat cycle test in which one cycle consisted of cooling at −65° C. for 30 minutes and then heating at 150° C. for 30 minutes, for 250, 500, 750 and 1000 cycles. The chips were observed for cracks or exfoliation and the number of chips without a crack and exfoliation was counted.

The results are as shown in Table 1.

TABLE 1

|  |  | Example | | | Comparative Example | | Referential Example | | |
| --- | --- | --- | --- | --- | --- | --- | --- | --- | --- |
|  |  | 1 | 2 | 3 | 1 | 2 | 1 | 2 | 3 |
| Viscosity(Pa · s, 25° C.) | | 57 | 48 | 55 | 58 | 50 | 53 | 55 | 56 |
| Storage stability | | A | A | A | C | A | A | A | A |
| Adhesion strength (MPa) | Initial | 1470 | 1390 | 1440 | 1480 | 1450 | 1380 | 1420 | 1400 |
|  | PCT 336 hr | 1270 | 1210 | 1230 | 1290 | 1300 | 1240 | 1280 | 1210 |
| Soldering properety | | 40/40 | 37/40 | 39/40 | 37/40 | 0/40 | 5/40 | 0/40 | 0/40 |
| Void | | 0/10 | 0/10 | 0/10 | 0/10 | 0/10 | 0/10 | 0/10 | 0/10 |
| Exfoliation | IR furnace 5 passes | 0/10 | 0/10 | 0/10 | 0/10 | 0/10 | 0/10 | 0/10 | 0/10 |
|  | PCT 336 hr | 0/10 | 0/10 | 0/10 | 0/10 | 0/10 | 0/10 | 0/10 | 0/10 |
| Temperature cycle | 250 cycles | 0/10 | 0/10 | 0/10 | 0/10 | 0/10 | 0/10 | 0/10 | 0/10 |
|  | 500 cycles | 0/10 | 0/10 | 0/10 | 0/10 | 0/10 | 0/10 | 0/10 | 0/10 |
|  | 750 cycles | 0/10 | 0/10 | 0/10 | 0/10 | 0/10 | 0/10 | 0/10 | 0/10 |
|  | 1000 cycles | 0/10 | 0/10 | 0/10 | 0/10 | 0/10 | 0/10 | 0/10 | 0/10 |

As shown in Table 1, the epoxy resin compositions of Examples had good storage stability, adhesion strength, and soldering properties to give reliable cured products with no void. On the other hand, the composition of Comparative example using the carboxylic acid as flux showed worse storage stability. The compositions in Referential Examples 1 to 3 comprising a phenol compound without sulfur showed soldering property worse than that of Examples.

The invention claimed is:

1. A liquid epoxy resin composition comprising:
   (A) a liquid epoxy resin;
   (B) an amine type curing agent;
   (C) a sulfur-containing phenol compound in an amount of from 1 to 20 parts by weight per total 100 parts by weight of the components (A) and (B); and
   (D) an inorganic filler in an amount of from 50 to 900 parts by weight per 100 parts by weight of the component (A).

2. The liquid epoxy resin composition according to claim 1, wherein the sulfur-containing phenol compound has an electron-donating substituent on at least one ortho-position relative to the phenolic hydroxyl group.

3. The liquid epoxy resin composition according to claim 1, wherein the sulfur-containing phenol compound is at lease one selected from the group consisting of 2,2-thiodiethylene bis[3-(3,5-di-t-butyl-4-hydroxyphenyl)propionate], 2,4-bisll [(octylthio)methyl]-o-cresol, and 4,4-thiobis-(2-t-butyl-5-methylphenol).

4. The liquid epoxy resin composition according to claim 1, wherein the component (B) is an aromatic amine.

5. The liquid epoxy resin composition according to claim 1, wherein the composition further comprises (E) a silicone-modified epoxy resin represented by the following formula (6) in an amount of from 0 to 20 parts by weight per 100 parts by weight of the component (A)

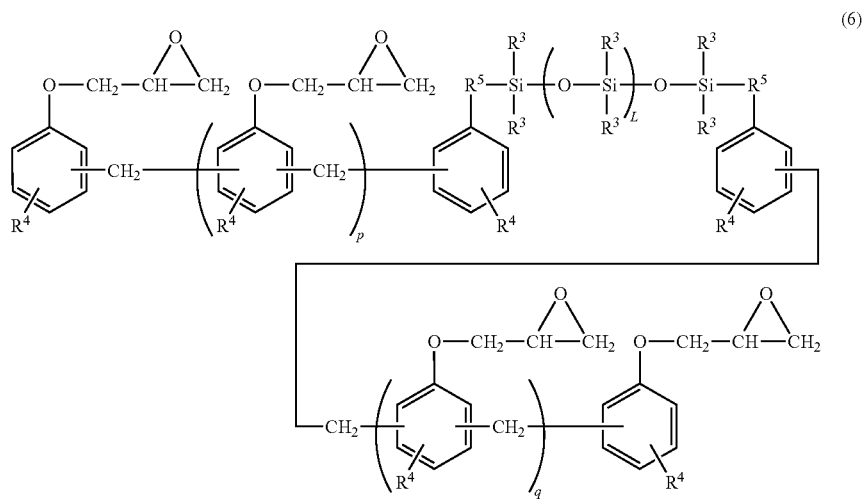

wherein $R^4$ is a hydrogen atom or a monovalent hydrocarbon group having 1 to 6 carbon atoms, $R^5$ is a divalent group represented by the formula, $-CH_2CH_2CH_2-$, $-OCH_2-CH(OH)-CH_2-O-CH_2CH_2CH_2-$, or $-O-CH_2CH_2CH_2-$, L is an integer of from 8 to 398, p is an integer of from 1 to 10, and q is an integer of from 1 to 10.

6. A method of manufacturing a flip-chip type semiconductor device which comprises encapsulating a flip-chip type semiconductor with the liquid epoxy resin composition according to any one of claims 1 to 5.

7. A flip-chip type semiconductor device wherein the flip-chip type semiconductor is encapsulated by a cured product of a liquid epoxy resin composition comprising: (A) a liquid epoxy resin; (B) an amine type curing agent; (C) a sulfur-containing phenol compound in an amount of from 1 to 20 parts by weight per total 100 parts by weight of the components (A) and (B); and (D) an inorganic filler in an amount of from 50 to 900 parts by weight per 100 parts by weight of the component (A).

\* \* \* \* \*